United States Patent [19]

Wojewoda et al.

[11] Patent Number: 5,777,524
[45] Date of Patent: Jul. 7, 1998

[54] TEMPERATURE COMPENSATION CIRCUIT FOR A CRYSTAL OSCILLATOR AND ASSOCIATED CIRCUITRY

[75] Inventors: Carl E. Wojewoda, Lake Zurich; James F. Caruba, Bartlett; Richard N. Sutliff, Hampshire, all of Ill.

[73] Assignee: Motorola, Inc., Schaumburg, Ill.

[21] Appl. No.: 901,892

[22] Filed: Jul. 29, 1997

[51] Int. Cl.$^6$ .............. H03L 1/02; H03L 5/00; H04B 1/40

[52] U.S. Cl. .......... 331/116 R; 331/158; 331/176; 331/177 V; 455/75; 455/79; 455/87

[58] Field of Search ............ 331/116 R, 116 FE, 331/158, 176, 177 R, 177 V; 455/75, 79, 84, 86, 87

[56] References Cited

U.S. PATENT DOCUMENTS 4,746,879  5/1988  Ma et al. .................. 331/176
5,081,431  1/1992  Kubo et al. ................ 331/116 R Primary Examiner—Siegfried H. Grimm
Attorney, Agent, or Firm—Brian M. Mancini; Gary J. Cunningham

[57] ABSTRACT

A temperature compensation circuit (10) for a crystal oscillator module (12) used in a communication device (200). An existing microcontroller (210) of the communication device (200) is used to provide temperature compensating digital data (30) for a crystal oscillator (18). The temperature compensating digital data (30) is converted to a temperature compensation signal (22) in a digital-to-analog converter (32) which controls the crystal oscillator frequency. The crystal oscillator module (12) includes an onboard voltage regulator (34) which supplies a characterized regulated voltage (36) to the digital-to-analog converter (32) such that the temperature compensation signal (22) from the digital-to-analog converter (32) is inherently corrected for voltage variations in the voltage regulator (34). Changes in the temperature compensation of the crystal oscillator (18) are allowed only when the communication device (200) is not transmitting or receiving.

11 Claims, 2 Drawing Sheets

TEMPERATURE COMPENSATION CIRCUIT FOR A CRYSTAL OSCILLATOR AND ASSOCIATED CIRCUITRY

FIELD OF THE INVENTION

The present invention relates generally to crystal oscillators used in a radio communication device and, in particular, to a temperature compensation circuit for a crystal oscillator and method of providing the same.

BACKGROUND OF THE INVENTION

A crystal oscillator is typically used to provide a reference frequency signal for a radio communication device. Temperature compensation (TC) circuits have typically been provided within the crystal oscillator to provide frequency stabilized radio communications over a wide range of temperatures. These compensation circuits may be composed of analog or digital devices and are used to provide a relatively flat frequency output over temperature. Typically, a variable capacitive element is provided to allow absolute adjustment of the final frequency of the oscillator. This capacitive element is generally either in the form of a trim capacitor or an analog varactor controlled by an applied DC voltage. By adjusting this capacitance, the user is able to adjust (frequency trim) the oscillator onto a desired final frequency. Generally, temperature compensated crystal oscillators provide about a 5 parts per million (ppm) frequency stability over temperature.

As should be recognized by those skilled in the art, the variation of operating frequency over temperature of a radio communication device depends not only on the reference crystal but also on associated circuit elements that are temperature sensitive. Analog varactors have their own variation with temperature, separate from the crystal temperature variation, which must be controlled by an applied voltage, as well as being compensated along with the crystal temperature variation. Therefore, a varactor will change capacitance over temperature even if provided with a constant voltage. However, a constant voltage is difficult to achieve because voltage regulators change output voltage over temperature even if provided with a constant input voltage. For good temperature performance of a varactor by itself, a very stable regulated voltage is required. However, this requires the use of a more expensive voltage regulator circuit which is often not an option. As a result, an external temperature sensitive voltage supplied to a crystal oscillator from an uncompensated radio communication device circuit, a D/A converter for example, will adversely affect the temperature performance of a crystal oscillator. In addition, adjusting the varactor while the radio is transceiving will change the operating frequency and possible disrupt the communication.

There is a need for a temperature compensated reference frequency source which: achieves temperature compensation with more simplified circuitry; does not require dedicated memory to store temperature compensation values, allows fewer, less expensive elements to be used, and provides temperature compensation of the crystal oscillator and other circuit elements coupled to the crystal oscillator. In addition, it is desirable to provide a low cost, small sized, low current drain, high yield crystal oscillator that allows control of the temperature compensation of the crystal oscillator and other circuit elements. Also, it is desirable to provide frequency adjustment of the crystal oscillator between radio transmissions.

DETAILED DESCRIPTION OF THE PREFERRED EMBODIMENT

Figure 1:
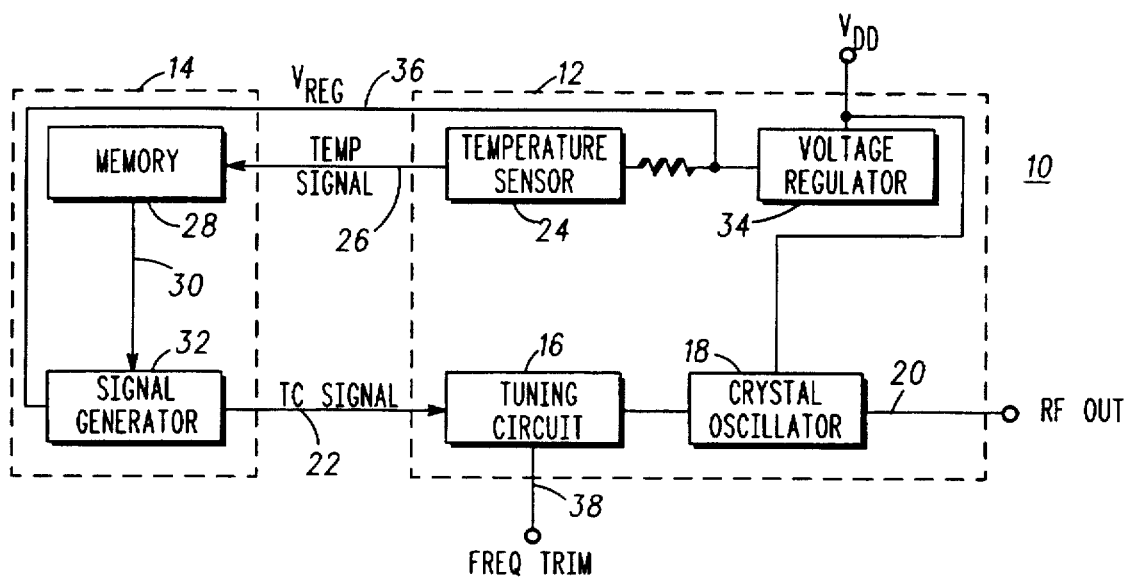
FIG. 1 is a block diagram of a temperature compensation circuit for a crystal oscillator, in accordance with the present invention.

FIG. 1 shows a temperature compensation circuit 10 providing a substantially temperature compensated frequency output 20, in accordance with the present invention. In this circuit 10, a memory 28 is used to provide temperature compensation digital data 30 to a crystal oscillator module 12 via a signal generator 32. Preferably, the memory 28 is an existing device on a radio circuit board 14 which saves costs. The signal generator 32 is powered by a regulated voltage 36 from a voltage regulator 34 that has been characterized over temperature. Preferably, the voltage regulator 34 is located within the crystal oscillator module 12 for ease of temperature characterization. The signal generator 32 can be located on either the radio circuit board 14 or the crystal oscillator module 12. Preferably, the signal generator 32 is an existing device on the radio circuit board 14 which saves costs. It should be recognized that having the signal generator 32 on the radio circuit board 14 would require additional input-output pins on the crystal oscillator module 12 to accommodate the digital data 30.

Typically, radio circuitry is not temperature compensated which leads to errors over temperature. This is particularly evident when driving temperature sensitive devices, such as crystal oscillators, with signals that have not been temperature compensated. For example, a signal generator being powered by an uncharacterized voltage regulator and driving a crystal oscillator with a temperature compensation signal will introduce errors due to shifts in the uncharacterized regulated voltage over temperature. Prior art crystal oscillators attempted to solve this problem by incorporating all the temperature sensitive circuitry, including a voltage regulator and a memory with temperature compensation data within a module which is subsequently characterized over temperature. However, this approach requires the use of a larger sized module to hold all the components with an expensive on-board application specific integrated circuit (ASIC) memory.

The present invention solves these problems by using an existing external memory 28 which saves costs, and by powering the signal generator 32 with the voltage regulator 34 within the crystal oscillator module 12 which has been characterized over temperature along with the crystal oscillator 18 and an associated tuning circuit 16. In this way, the present invention no longer requires an on-board ASIC, and surprisingly, a substantially improved temperature compensated output frequency 20 is obtained. The present invention advantageously provides temperature compensation of the crystal oscillator 18 and tuning circuit 16 as well as the signal generator 32 while using existing memory 28 of a radio instead of a separate memory on-board the crystal oscillator module 12.

Another problem with independent digitally compensated crystal oscillators 18 is where the temperature compensation orders a change in frequency in response to a temperature change while the radio is transceiving. This will cause the frequency to shift which can disrupt the communication.

The present invention solves this problem by allowing the radio to determine when to provide a temperature compensation correction. The radio can inhibit a change to the temperature compensation during transmissions since the compensation is dependent on the existing external memory of the radio. In this way, sudden frequency changes during transmitting or receiving are eliminated.

The temperature compensation circuit 10 for the crystal oscillator 18 includes a tuning circuit 16 electrically coupled to the crystal oscillator 18. The tuning circuit 16 contains a reactive load which is coupled to the crystal oscillator 18 and is used to adjust an output frequency 20 of the crystal oscillator 18 in response to a temperature compensation signal 22. A temperature sensor 24 in the crystal oscillator module 12 provides a temperature signal 26 in response to an ambient temperature of the crystal oscillator 18. A memory 28 is electrically coupled to the temperature sensor 24 and is programmed to provide predetermined digital data 30 in response to the temperature signal 26. The predetermined digital data is programmed to vary as a function of a frequency deviation of the crystal oscillator module 12 over temperature. Preferably, the predetermined digital data 30 is programmed to also compensate a reactance variation of the tuning circuit 16 and a voltage variation of a voltage regulator 34 over temperature.

The voltage regulator 34 is electrically coupled to the temperature sensor 24 with a regulated voltage 36. A signal generator 32 is electrically coupled to the memory 28. The signal generator 32 may be located either within the crystal oscillator module 12 or on the radio circuit board 14, as shown. The signal generator 32 provides a temperature compensation signal 22, corresponding to the predetermined digital data 30 from the memory 28, to the tuning circuit 16. However, the accuracy of the temperature compensation signal 22 would be adversely affected if it were driven off of an uncompensated voltage regulator of the radio power supply. Uncompensated voltage regulators have a volts per degree C. (V/°C.) dependence that, when applied to the signal generator 32, will cause the compensation signal to follow the change in volts over temperature.

Advantageously, the characterized voltage regulator 34 of the crystal oscillator module 12 supplies a regulated voltage 36 to power the signal generator 32. This characterization information is summed into the information supplied with the oscillator module 12. During preliminary testing, as the oscillator module 12 is swept over temperature, the temperature sensor 24, tuning circuit 16 and voltage regulator 34 data is recorded. This data is then used to compute the required compensation signal 22 to the signal generator 32, and the data is supplied with each oscillator module 12 to an end user radio communication device manufacturer. Because the voltage regulator 34 of the crystal oscillator module 12 has been temperature characterized, along with the crystal oscillator 18 itself and the tuning circuit 16, this characterized regulated voltage 36 can be used beneficially to power the signal generator 32. In this way, the temperature compensation signal 22 from the signal generator 32 is inherently compensated for voltage variations of the voltage regulator 34 over temperature. This improves the overall temperature compensation performance of the temperature compensation circuit 10, where the generated compensation signal 22 from the signal generator 32 is more accurate due to the characterized information supplied with the oscillator module 12.

Figure 2:
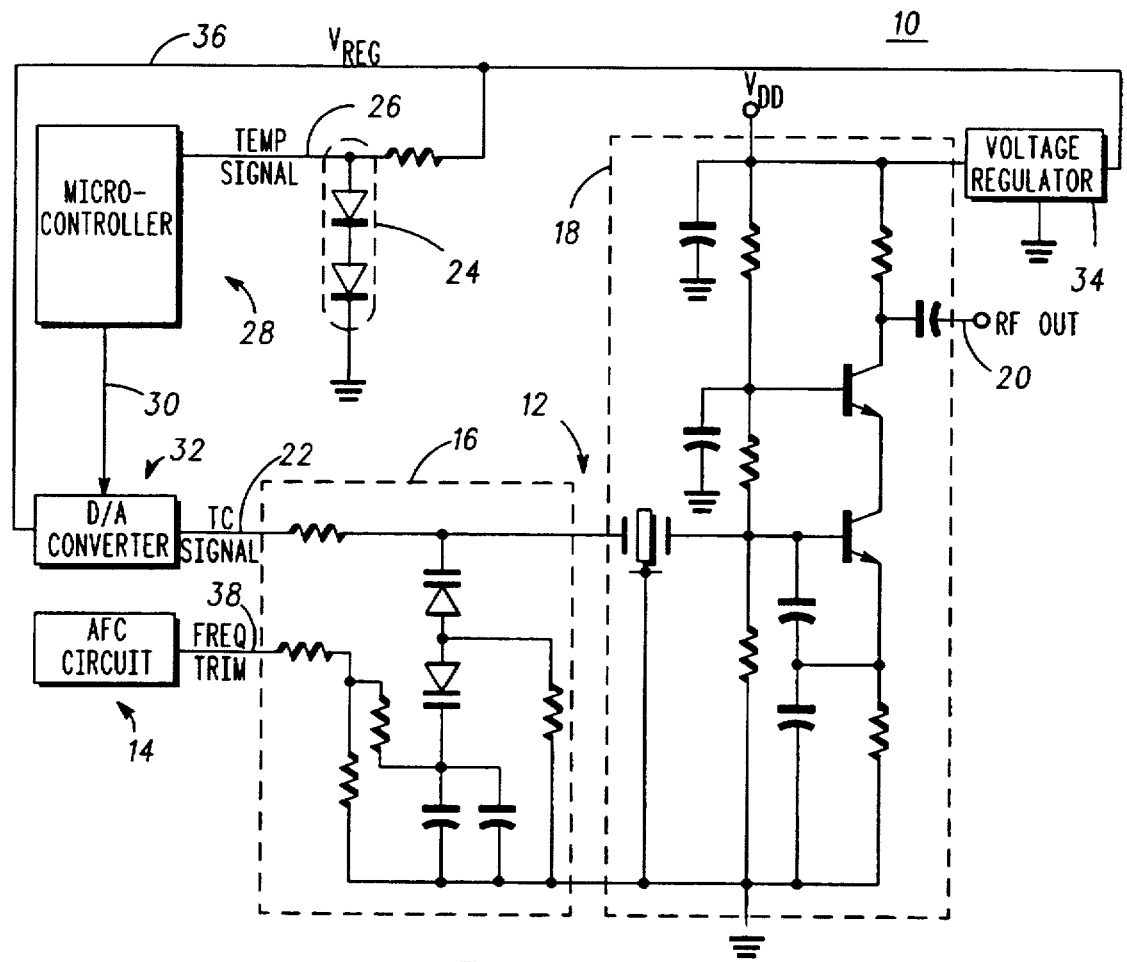
FIG. 2 is a schematic diagram of a preferred embodiment of the circuit of FIG. 1, in accordance with the present invention.

FIG. 2 shows a schematic diagram of a preferred embodiment of the temperature compensation circuit 10 of FIG. 1, in accordance with the present invention. This embodiment includes a frequency trim signal 38 coupled to the tuning circuit 16. In response to the frequency trim signal 38, the tuning circuit 16 adjusts a nominal output frequency of the crystal oscillator 18. The frequency trim signal 38 is supplied externally from the crystal oscillator module 12, typically via an automatic frequency control (AFC) circuit. The signal generator 32 is most easily provided by a digital-to-analog (D/A) converter. However, other similar circuits may be used. In general, the D/A converter utilized is located on the radio circuit board 14. However, it may be located within the crystal oscillator module 12 if appropriate data connections are made.

Preferably, the signal generator 32 is an existing D/A converter on the radio board which is utilized part of the time for occasional radio functions and is available the remaining time for temperature compensation. The signal generator 32 provides at least one latched output buffer (not shown) for the compensation signal 22 in order to maintain the compensation when the D/A converter is busy performing its radio tasks. In effect, the D/A is multiplexed between radio functions and providing a temperature compensation signal for crystal oscillator compensation. Advantageously, this embodiment also allows the radio to provide a change in temperature compensation only when the radio is not transmitting or receiving. In addition, the cost of an extra D/A converter on the radio board is avoided.

Prior art D/A converters are powered off of the radio power supply voltage regulator (not shown). In contrast, a surprising and unexpected advantage of the present invention is to instead power the D/A converter off of the voltage regulator 34 of the crystal oscillator module 12. Better than 2 ppm temperature stability of the output frequency 20 is achieved by biasing the D/A converter off of the temperature characterized regulated voltage 36 of the crystal oscillator module 12. Since the D/A converter is running off of the voltage regulator 34 of the crystal oscillator module 12, the D/A output (temperature compensation signal 22) is much more accurate over temperature than it would be if the D/A converter is biased off of the uncharacterized radio power supply regulator. Preferably, the crystal oscillator module 12 will use the regulated voltage 36 of the voltage regulator 34 to bias a D/A converter 32 with approximately the same input impedance as a prior art radio D/A converter so as to maintain a uniform temperature compensation. An alternative to the above embodiment is for the radio manufacturer to temperature characterize the power supplies of every radio for the benefit of the crystal oscillator manufacturer. Obviously, this is an expensive and complex solution which the present invention advantageously avoids at a much reduced cost.

The temperature sensor 24 may be provided by a cascaded diode string of at least one diode, a thermistor, or a transistor. Of these, the diode string is the lowest cost. Thermistors typically have manufacturing tolerance variations from lot to lot, and unit to unit. A diode string can be integrated, and therefore, manufactured to be substantially exactly matched in geometry and current flow. In a preferred embodiment, the temperature sensor consists of two integrated cascaded diodes. Integration allows the diodes to be fabricated such that they are well matched in geometry and therefore in current flow which is an advantage for providing a repeatable voltage across the diode string.

The voltage across each diode of the temperature sensor is approximated by:

$$V_D = \left( \frac{q}{nkT} \right) * \ln\left( \frac{i_D}{I_o} \right)$$

where q is the electron charge, n is the empirically determined exponential ideality factor, k is Boltzmann's constant, T is the absolute temperature, $i_D$ is the current through the diode, and $I_o$ is the reverse saturation current of the diode. The temperature sensor of the present invention preferably uses two cascaded diodes which results in a temperature signal of $2V_D$. In operation, $V_D$ is about 0.6V at room temperature and the temperature sensor has a temperature signal sensitivity of about 4 mV/°C, which is very repeatable due to the integrated manufacturing process used in the present invention.

The diodes of the temperature sensor will fundamentally have a fixed ratio for ($i_D/I_o$). Advantageously, this information can be permanently stored in the memory without having to actually determine the temperature variance on a diode-to-diode basis. Alternatively, each temperature sensor can be characterized over temperature for ultimate accuracy. However, this requires more data processing and is not necessary to realize the 2 ppm temperature stability of the present invention.

As should be recognized, a larger number of diodes in the diode string provides increased temperature sensitivity. However, this must be balanced against the available supply potential of the radio since only a higher potential will support more diodes in the diode string. In the low voltage power supply embodiment shown, two diodes are cascaded in the diode string.

The tuning circuit 16 is provided by a reactive load, such as varactor diodes connected as shown, coupled to the crystal oscillator 18. Preferably, the crystal oscillator is of a Colpitts design which is known in the art. However, other designs may be used equally well. The varactor diodes provide a low cost method of providing variable reactance. However, other tunable reactive load elements available in the art, such as voltage variable capacitors (VVCs), may be used successfully in the present invention.

The memory 28 is best provided through an existing memory element located within the radio or communication device. Most advantageously, the memory 28 is the main microprocessor or microcontroller of the radio since this is already existing. However, other available memory devices may be used, such as digital signal processors, PROM, EPROM, EEPROM, SRAM, DRAM, digital-to-analog converters, and the like, whether pre-existing in the radio or provided separately.

The advantage of using existing memory devices is that a separate, redundant memory element is no longer needed in the crystal oscillator module 12 which provides a substantial cost savings. Moreover, if a memory device is available that has an analog output, such as having an on-board D/A then the signal generator 32 of the present invention can be eliminated. However, it should be noted that in this case it would be necessary to drive the memory device with the voltage regulator 34 of the crystal oscillator module 12 to retain the temperature characterized benefits discussed above.

The memory 28 is programmed with predetermined digital data 30 which substantially corresponds to an inverse function of the frequency deviations of the crystal oscillator module 12 over temperature. For a crystal oscillator 18 using an AT-cut crystal, which is preferred, the inverse function corresponds to the well known Bechmann curve, which can be well characterized by a third or higher nth-order polynomial expansion. A fourth order expansion is preferred for its additional accuracy in characterizing the Bechmann curve. However, higher order best-fit polynomials (n≥7) will provide greater accuracy.

In operation, the polynomial coefficients of the Bechmann curve are calculated for each crystal oscillator module 12 and these values are programmed into the memory 28. Alternatively, the memory 28 may be programmed with a look-up table of actual frequency deviations of the crystal oscillator module 12 over discrete temperature ranges which may be called up and provided to the signal generator 32 as digital data 30. In this case, the digital data 30 in the look-up table would correspond to the temperature signal 26 provided by the temperature sensor 24 to the memory 28. This alternative requires more memory space, but will work equally well.

As an added benefit, the deviations in the voltage regulator 34 and tuning circuit 16 over temperature are automatically incorporated within the predetermined digital data 30 since the crystal oscillator module 12 is temperature characterized as a whole unit. The memory 28 provides digital data 30 corresponding to the inverse function of the Bechmann curve to the signal generator 32 for translation into an analog temperature compensation signal 22 for driving the tuning circuit 16 of the crystal oscillator module 12. The memory 28 and signal generator 32 need not be temperature characterized because their deviations over temperature are inconsequential. However, there is nothing in the present invention to prevent doing this.

The advantage of the present invention is to have the signal generator 32, preferably a D/A converter, biased off of the crystal oscillator module voltage regulator 34, whose voltage variation over temperature is characterized. In this way, the temperature compensation signal 22 from the D/A converter is inherently corrected, for voltage variations in the voltage regulator 34, in accordance with the present invention. Surprisingly, biasing the D/A converter off of the crystal oscillator module voltage regulator 34 results in an improvement in frequency stability from about 5 ppm to about 2 ppm. Furthermore, this improvement is achieved without the use of ASIC temperature compensation circuitry on-board the crystal oscillator module 12 which results in a significant cost savings.

Figure 3:
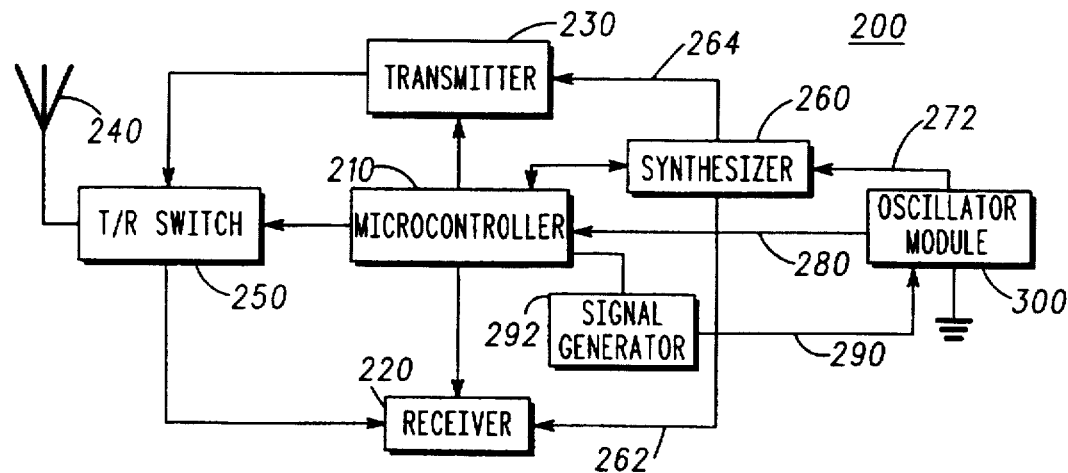
FIG. 3 is a block diagram of a communication device which uses the temperature compensation circuit of the present invention.

FIG. 3 shows a block diagram of a communication device 200 which includes a temperature compensated circuit, in accordance with the present invention. In one embodiment, the communication device 200 is a transceiver. The communication device 200 comprises a well known frequency synthesized two-way transceiver which operates under the control of a microcontroller 210 or microprocessor. The communication device 200 includes a receiver 220 and a transmitter 230 which receive and transmit RF via an antenna 240. The antenna 240 is appropriately switched between the receiver 220 and the transmitter 230 by an antenna switch 250. The communication device 200 also includes a well known phase locked loop synthesizer 260 which under the control of the microcontroller 210 provides a receiver local oscillator signal 262 and a transmitter local oscillator signal 264. The temperature compensated circuit includes a reference oscillator module 300 providing a reference oscillator signal 272 for the synthesizer 260 and a temperature signal 280 for the microcontroller 210. The microcontroller 210 provides a temperature compensation signal 290 to the reference oscillator module 300 via a signal generator 292. The reference oscillator signal 272 is temperature compensated utilizing the principles of the present invention.

Figure 4:
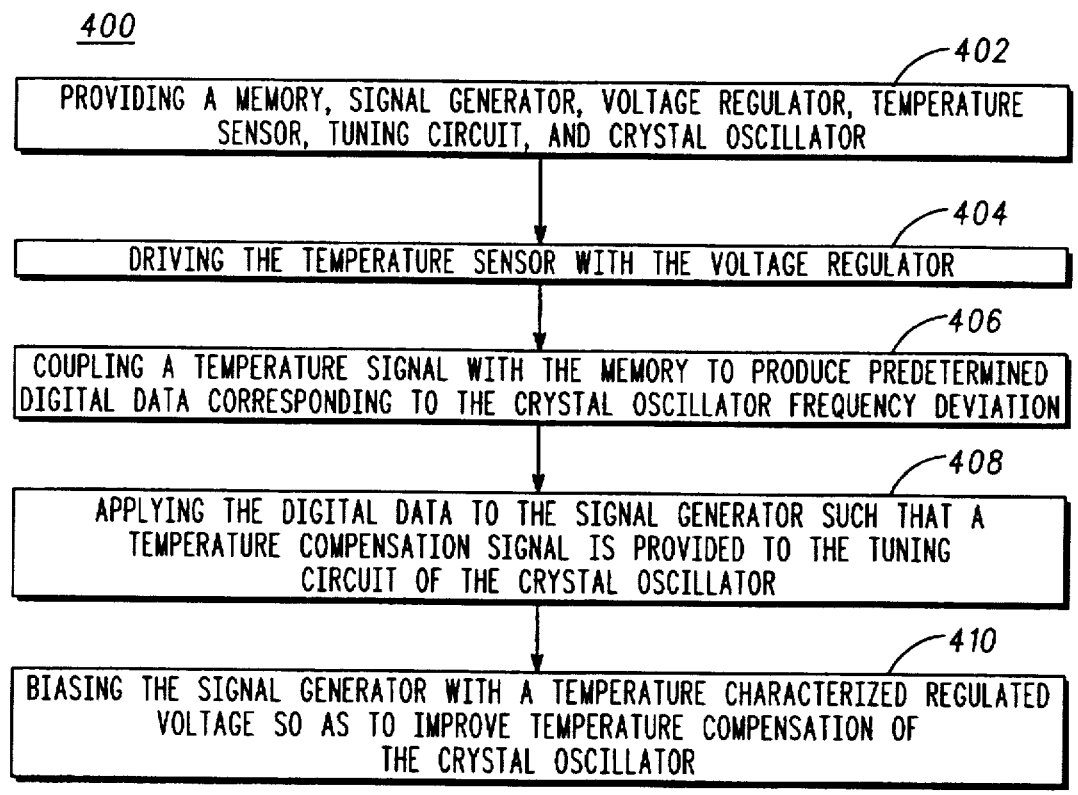
FIG. 4 is a flow diagram of a method to provide a temperature compensated frequency output, in accordance with the present invention.

FIG. 4 shows a flow diagram of a method 400 to provide a temperature compensated reference frequency output, in accordance with the present invention. This method 400 includes a first step 402 of providing a memory programmed with digital data corresponding to a deviation over temperature of at least one of the group selected from the crystal oscillator, a signal generator, a voltage regulator, a temperature sensor, and a tuning circuit coupled to the crystal oscillator. A second step 404 includes driving the temperature sensor with the voltage regulator such that a temperature-dependent signal corresponding to an ambient temperature is provided. A third step 406 includes coupling the temperature-dependent signal to the memory such that digital data corresponding to the frequency variation of the crystal oscillator at the ambient temperature is provided. The memory containing a look-up table with predetermined digital data corresponding to a frequency deviation of the crystal oscillator. A fourth step 408 includes applying the digital data to the signal generator when an associated radio circuit is not transmitting or receiving such that a temperature compensation signal is provided to the tuning circuit of the crystal oscillator. A last step 410 includes biasing the signal generator with a temperature characterized regulated voltage from the voltage regulator such that variations in the regulated voltage are compensated in the digital data so as to improve temperature compensation of the crystal oscillator.

Although various embodiments of this invention have been shown and described, it should be understood that various modifications and substitutions, as well as rearrangements and combinations of the preceding embodiments, can be made by those skilled in the art, without departing from the novel spirit and scope of this invention.

What is claimed is:

1. A temperature compensation circuit for a crystal oscillator, comprising:

a tuning circuit electrically coupled to the crystal oscillator, the tuning circuit adjusting an output frequency of the crystal oscillator in response to a temperature compensation signal;

a temperature sensor providing a temperature signal in response to an ambient temperature of the crystal oscillator;

a memory being electrically coupled to the temperature sensor and programmed to provide predetermined digital data in response to the temperature signal, the predetermined digital data programmed to vary as a function of a deviation of the crystal oscillator and the tuning circuit over temperature, the memory inhibiting changes to the provided predetermined digital data while an associated radio circuit is transmitting or receiving;

a signal generator being electrically coupled to the memory, the signal generator providing the temperature compensation signal corresponding to the predetermined digital data to the tuning circuit; and a voltage regulator providing a regulated voltage to the signal generator, the voltage regulator being electrically coupled to the temperature sensor.

2. The temperature compensation circuit of claim 1, wherein the signal generator is a digital-to-analog converter existing in the associated radio circuit.

3. The temperature compensation circuit of claim 2, wherein the digital-to-analog converter is multiplexed between providing a latched temperature compensation signal to the tuning circuit and providing a radio function.

4. The temperature compensation circuit of claim 1, wherein the memory has an analog output which provides the temperature compensation signal corresponding to the predetermined digital data and which is directly applied to the tuning circuit bypassing the signal generator.

5. The temperature compensation circuit of claim 4, wherein the memory is powered by the voltage regulator.

6. A communication device having a transmitter, a receiver and memory and having a temperature compensation circuit, comprising:

the memory being programmed to provide predetermined digital data in response to a temperature signal, the predetermined digital data programmed to vary as a function of a deviation over temperature of elements of a local oscillator circuit, the memory inhibiting changes to the provided predetermined digital data while an associated radio circuit is transmitting or receiving;

a signal generator being electrically coupled to the memory, the signal generator providing a temperature compensation signal to the local oscillator circuit corresponding to the predetermined digital data from the memory; and the local oscillator circuit for generating local oscillator signals includes a temperature dependent crystal oscillator comprising:

a tuning circuit electrically coupled to the crystal oscillator, the tuning circuit adjusting an output frequency of the crystal oscillator in response to the temperature compensation signal;

a temperature sensor electrically coupled to the memory and providing the temperature signal to the memory in response to an ambient temperature of the crystal oscillator; and a voltage regulator providing a regulated voltage to the signal generator, the voltage regulator being electrically coupled to the temperature sensor.

7. The communication device of claim 6, wherein the predetermined digital data is programmed to vary as a function of the deviation over temperature of at least one of the elements of the local oscillator circuit selected from the group consisting of the temperature sensor, the tuning circuit, the crystal oscillator, and the voltage regulator.

8. The communication device of claim 6, wherein the signal generator is a digital-to-analog converter existing in the associated radio circuit.

9. The communication device of claim 8, wherein the digital-to-analog converter is multiplexed between providing a latched temperature compensation signal to the tuning circuit and providing a radio function.

10. A method of temperature compensating a crystal oscillator, comprising the steps of:

providing a memory programmed with digital data corresponding to a deviation over temperature of at least one of the group selected from the crystal oscillator, a signal generator, a voltage regulator, a temperature sensor, and a tuning circuit coupled to the crystal oscillator;

driving the temperature sensor with the voltage regulator such that a temperature-dependent signal corresponding to an ambient temperature is provided;

coupling the temperature-dependent signal to the memory such that digital data corresponding to a frequency variation of the crystal oscillator at the ambient temperature is provided;

applying the digital data to the signal generator when an associated radio circuit is not transmitting or receiving such that a temperature compensation signal is provided to the tuning circuit of the crystal oscillator; and biasing the signal generator with a temperature characterized regulated voltage from the voltage regulator such that variations in the regulated voltage are compensated in the digital data so as to improve temperature compensation of the crystal oscillator.

11. The method of claim 10, wherein the providing step includes the signal generator being a digital-to-analog converter existing in the associated radio circuit.

* * * * *